United States Patent [19]
Braun

[11] Patent Number: 6,110,277
[45] Date of Patent: Aug. 29, 2000

[54] PROCESS FOR THE FABRICATION OF EPITAXIAL LAYERS OF A COMPOUND SEMICONDUCTOR ON MONOCRYSTAL SILICON AND LIGHT-EMITTING DIODE FABRICATED THEREFROM

[75] Inventor: Matthias Braun, Weinsberg, Germany

[73] Assignee: Temic Telefunken microelectronic GmbH, Heilbronn, Germany

[21] Appl. No.: 09/059,343

[22] Filed: Apr. 14, 1998

[30] Foreign Application Priority Data

Apr. 15, 1997 [DE] Germany ............................ 197 15 572

[51] Int. Cl.[7] .................................................. C30B 25/18
[52] U.S. Cl. .................................. 117/94; 117/95; 117/97; 117/101; 117/952
[58] Field of Search ................................ 117/95, 94, 101, 117/97, 952

[56] References Cited

FOREIGN PATENT DOCUMENTS 0764989  3/1997  European Pat. Off. .

OTHER PUBLICATIONS

S. Kitamura et al.: "Fabrication of GaN Hexagonal Pyramids on Dot–Patterned GaN/Sapphire Substrates . . . ". In: Jpn. J. Appl. Phys., vol. 34, 1995, pp. 1184–1186.

P. Kung et al.: "High quality AlN and GaN epilayers grown on (00.1) sapphire, (100), and (111) silicon substrates". In: Appl. Phys. Lett, 66 (22), May 1995, pp. 2958–2960.

Primary Examiner—Robert Kunemund
Attorney, Agent, or Firm—Venable; George Spencer; Norman N. Kunitz

[57] ABSTRACT

A process for the fabrication on a monocrystal silicon substrate of epitaxial layers of a III–V nitride compound semi-conductor having the structure $In_xAl_yGa_{1-x-y}N$ ($0 \leq x$, $0 \leq y$, $x+y \leq 1$). The process consists of the following steps. A parcel-like structure is created on the surface of a monocrystal silicon substrate. The silicon surface within the parcels is uncovered and the edges of the parcels are covered by a masking material. By means of epitaxial growth of the nitride compound semiconductor exclusively within the parcels on the silicon surface, local islands are created on whose edges the dislocations generated by the lattice mismatches are able to break down. Finally, components are fabricated in and on the parcels.

13 Claims, 2 Drawing Sheets

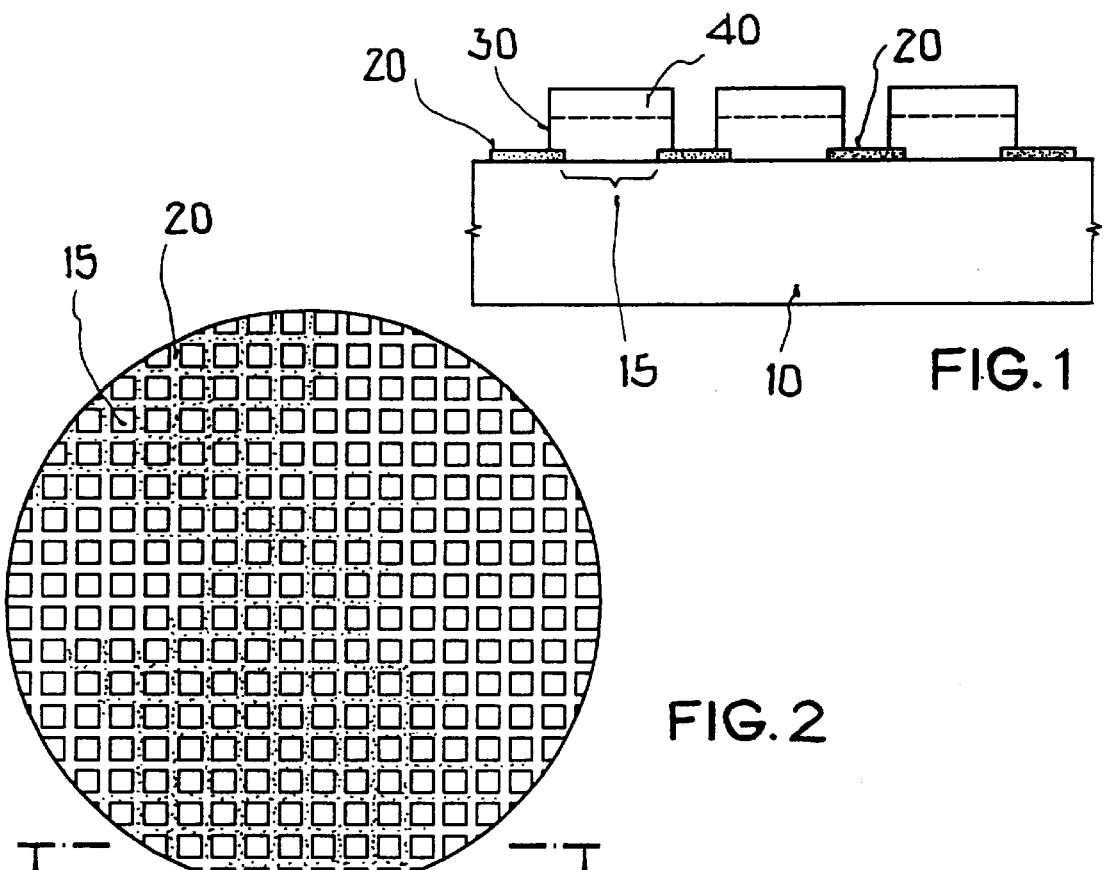
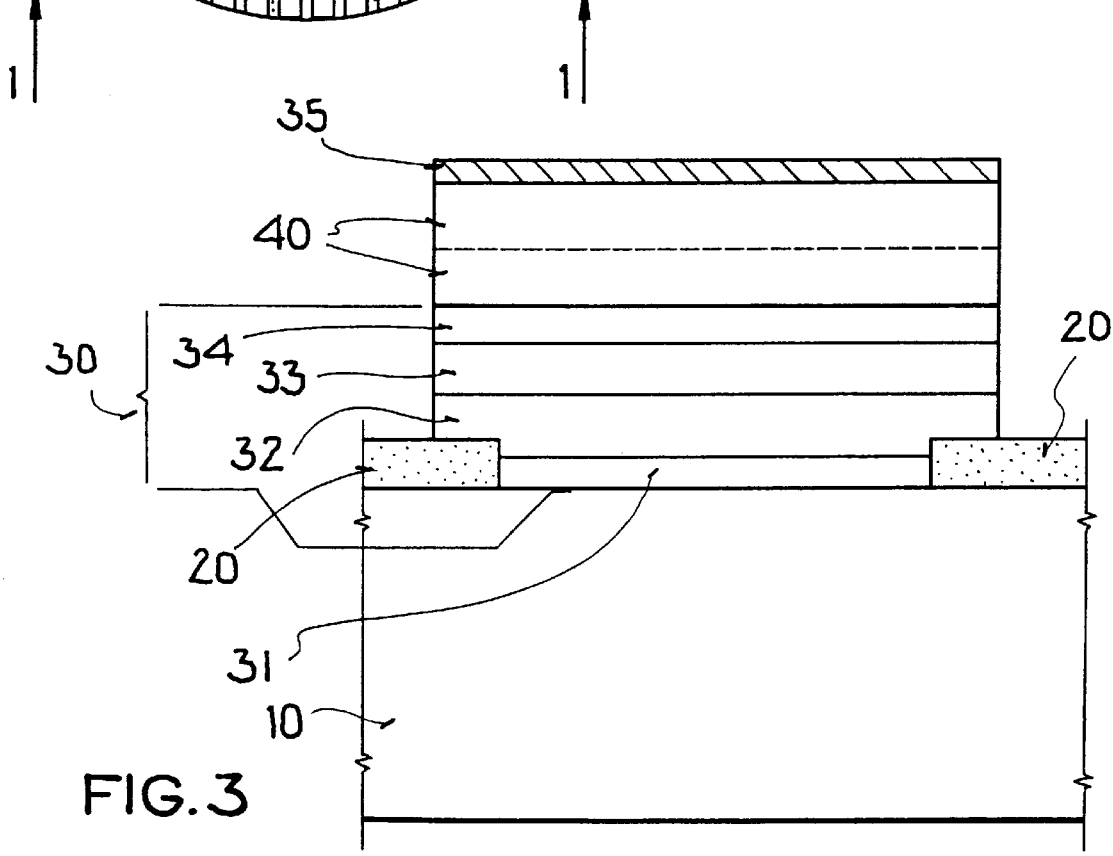

PROCESS FOR THE FABRICATION OF EPITAXIAL LAYERS OF A COMPOUND SEMICONDUCTOR ON MONOCRYSTAL SILICON AND LIGHT-EMITTING DIODE FABRICATED THEREFROM

BACKGROUND OF THE INVENTION

Owing to their physical properties III–V nitride compound semiconductors having the structure $In_xAl_yGa_{1-x-y}N$ ($0 \leq x$, $0 \leq y$, $x+y \leq 1$) are of major importance for optoelectronic applications. To fabricate such semiconductor layers of high crystalline quality as are required for optoelectronic applications, for example, various epitaxial processes are employed. In addition to molecular beam epitaxy, for the most part vapor-phase epitaxy and especially metal-organic vapor-phase epitaxy (MOVPE) are utilized. Here, the growing temperature, depending on the material system, is typically 700–1100° C. To grow crystalline layers, a suitable substrate has to be used. Sapphire ($Al_2O_3$) or silicon carbide (SiC) have proved to be suitable substrates for III–V nitride compound semiconductors having the structure $In_xAl_yGa_{1-x-y}N$ ($0 \leq x$, $0 \leq y$, $x+y \leq 1$). As a substrate material, silicon carbide (SiC) is very expensive. Sapphire ($Al_2O_3$) is not conductive and, owing to its mechanical hardness, very difficult to work. Where the substrate is not conductive, all contacts have to be applied on the front side of the components. This uses up additional, expensive epitaxy space.

Silicon is a very common and attractive substrate material. It is mechanically stable, inexpensive, available almost without restriction, temperature stabile and conductive. It would therefore make a generally desirable substrate for the above-mentioned compound semiconductors. From P. Kung et al, Appl. Phys. Lett 66, 2958 (1995) we know that silicon, in principle, is suitable for the deposition of crystalline AlN and GaN layers and their ternary and quaternary compound semiconductors. Yet the authors note that the AlN and GaN layers produced on a silicon substrate exhibit crystals of insufficient quality for the fabrication of electronic components.

SUMMARY OF THE INVENTION

The object of the invention is therefore to provide a process for the fabrication of epitaxial layers comprising III–V nitride compound semiconductors having the structure $In_xAl_yGa_{1-x-y}N$ ($0 \leq x$, $0 \leq y$, $x+y \leq 1$) which allows the generation of semiconductor layers having crystals of sufficient quality for the fabrication of electronic components.

The process in accordance with the invention is based upon the use of selective epitaxy in order to permit the growth on a silicon substrate of III–V nitride compound semiconductors having the structure $In_xAl_yGa_{1-x-y}N$ ($0 \leq x$, $0 \leq y$, $x+y \leq 1$) and having crystals of sufficient quality for electronic components. In selective epitaxy the silicon substrate is locally masked prior to the growth of the semiconductor layers. The masking material obstructs or prevents the growth of the semiconductor layers on the substrate material. It can be formed by deposition of a masking layer of an additional material, but also by oxidation of the silicon substrate, in particular. In the areas not covered by the mask the growth of the semiconductor material is effected selectively. Growth parcels are formed on whose. edges the dislocations that arise are able to break down. The occurrence of microcracks is thus prevented. The parcels later form the base material for the fabrication of one or more than one component in each case.

The parcels are used in particular for the fabrication of light-emitting diodes.

By way of example, the present invention will be described with reference to the accompanying drawings, in which:

BRIEF DESCRIPTION OF THE DRAWINGS

FIG. 1 is an enlarged view of Section 1—1 of FIG. 2 with semiconductor material grown on the growing parcels;

FIG. 2 is a view from above of a silicon substrate wafer with growing parcels restricted by silicon dioxide;

FIG. 3 is a section showing the semiconductor configuration;

DESCRIPTION OF THE PREFERRED EMBODIMENTS

Figure 4:
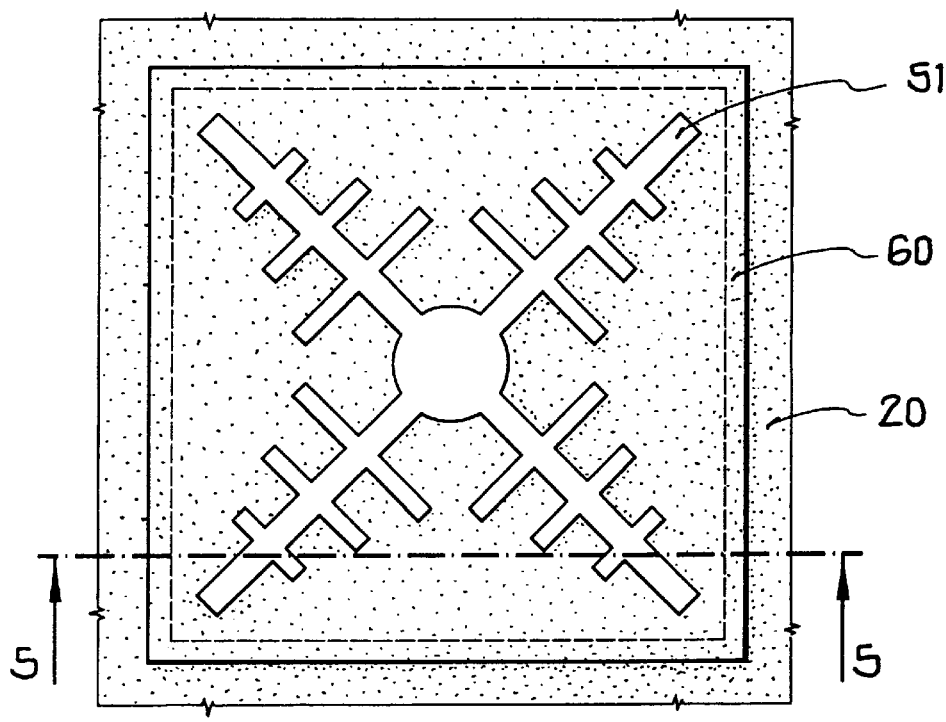
FIG. 4 is a view from above of a light-emitting diode in accordance with the invention.

Preliminary to the epitaxial preparation of the semiconductor layers a masking layer 20 is created first on the surface of the silicon substrate 10 by oxidation of the substrate and then structured by a photolithographic process. This defines the parcels 15, which are not covered by the masking layer 20. The edges of the parcels are covered by masking material. The epitaxial growth of the nitride compound semiconductor 30, 40 occurs exclusively or preferably in the parcels on the silicon surface of the substrate (10). The components are subsequently fabricated from the semiconductor material that was grown on these parcels 15. The parcels can be as big as several square millimeters.

In another version of the process the material of the masking layer 20 is deposited on the surface of the substrate (10) and then structured by a photolithographic process. The remaining process steps are effected in the same manner. Silicon dioxide SiO2 and silicon oxinitride SiON have proved suitable as masking material. The layers of the III–V nitride compound semiconductor having the structure $In_xAl_yGa_{1-x-y}N$ ($0 \leq x$, $0 \leq y$, $x+y \leq 1$) are grown epitaxially by means of MOVPE or another suitable process. First, a sequence of layers 31, 32, 33 acting as a lattice matching region is allowed to grow. The lattice matching region overcomes or reduces the lattice mismatch between the silicon substrate and the epitaxial semiconductor layer subsequently grown at least to the extent that the layers of the active components exhibit a sufficiently high perfection of the crystal structure.

The lattice matching region 31, 32, 33 is made up of several part layers: a nucleation layer 31 is grown first. Layers that contain aluminum are particularly suitable for this purpose. The nucleation layer 31 in the version under consideration is made up ideally of GaAlN or GaAlAsN, but may also consist of GaN or AlN. Thereafter the upper matching layers 32, 33 are produced, preferably by means of thermally cyclical growth and/or thermal cycling of layers of the named nitride compound semiconductors. Preferably, a combination of these methods is used, in particular in the lower part of the lattice matching region. A further improvement in crystal quality can be accomplished by subsequently growing buffer layers 33 and/or superlattices in the upper part of the lattice matching region 32. Thereafter the crystal quality is good enough to permit the growth of the active component layers. A part of the upper lattice matching region may already be part of the active layers. Advantageously, if an optoelectronic component such as an LED or a diode laser is to be fabricated, a Bragg reflector 34 is to be grown between the active layers 40 containing the light generating p/n junction and the substrate 10 or the lattice matching region 31, 32, 33 in order to maximize the luminous efficiency. This allows the luminous efficiency to be increased, as the silicon substrate strongly absorbs light at the emitted wavelength. The Bragg reflector can also form a part of the upper lattice matching region 32, 33.

Semiconductors based upon GaN are characterized by a high bandgap. The fabrication of low-ohmic contacts on the surfaces of these semiconductors is therefore problematic. For this reason it is intended to apply to the surface of the semiconductor based upon GaN layers 35 having a lower bandgap and thus a different lattice constant and coefficient of thermal expansion which, outside the contact region, can be selectively removed again if necessary during the course of the technology process. This can be done, for example, by means of selective etching. Here, on account of the varying material parameters, selective epitaxy is also of major importance for the growth of contact/etched layers.

Figure 5:
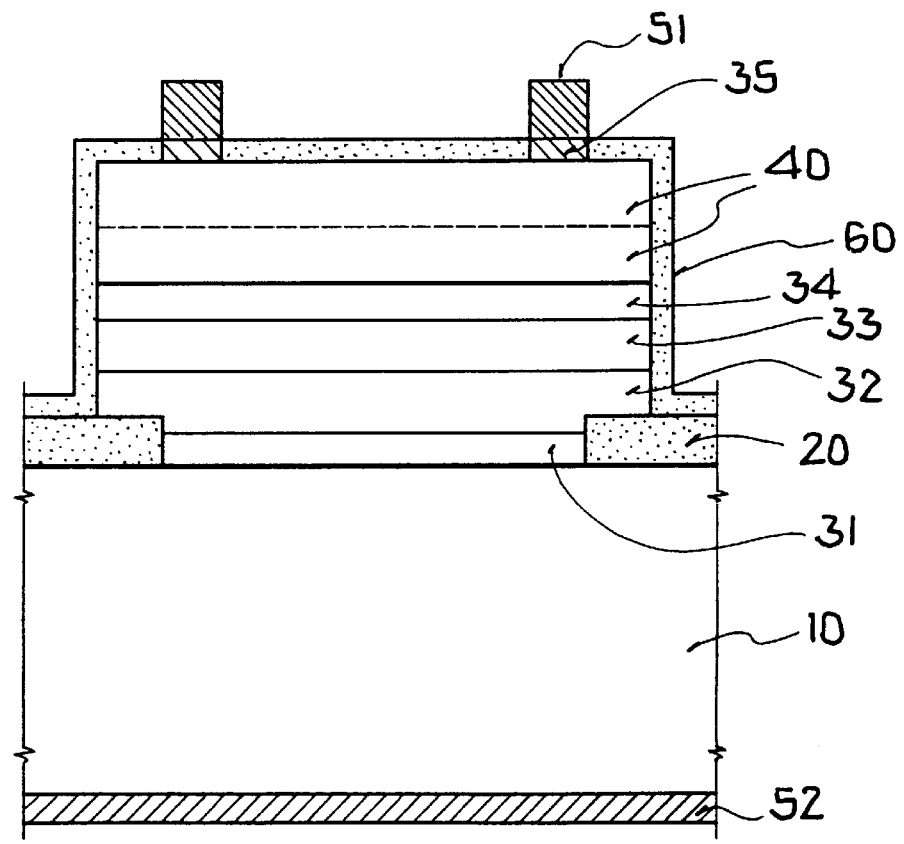
FIG. 5 is a section showing the light-emitting diode of FIG. 4 along line 5—5.

The light-emitting diode shown at FIGS. 4 and 5 is made up of the epitaxial layer sequences of a III–V nitride compound semiconductor having the structure $In_xAl_yGa_{1-x-y}N$ ($0 \leq x$, $0 \leq y$, $x+y \leq 1$) as described above. The surface of the diode chip is coated with a passivation layer 60. The rear side contact 52 and the structured front side contact 51 are not covered by this layer.

This type of light-emitting diode is optimized especially for the green, blue and violet spectral region and is characterized by its extraordinary efficiency.

What is claimed is:

1. Process for the fabrication of epitaxial layers of a III–V nitride compound semi-conductor having the structure $In_xAl_yGa_{1-x-y}N$ ($0 \leq x$, $0 \leq y$, $x+y \leq 1$) on a substrate made up of monocrystal silicon, such process comprising the following steps:

providing the monocrystal silicon substrate;

creating a parcel-like structure on the surface of the substrate, such that the silicon surface in the parcel is uncovered and the edges of the parcels are covered by a masking material;

growing a nucleation layer on the silicon surface in the parcels; and epitaxially growing the nitride compound semiconductor exclusively in the parcels on the nucleation layer.

2. Process as claimed in claim 1, wherein silicon dioxide $SiO_2$ or silicon oxinitride SiON deposited on the surface of the substrate is used as masking material.

3. Process as claimed in claim 1, wherein silicon dioxide $SiO_2$ grown on the surface of the substrate is used as masking material.

4. Process as claimed in claim 1, wherein the nucleation layer contains one of arsenic nitride AsN and nitrogen N.

5. Process as claimed in claim 1, wherein a lattice matching region comprising several part layers is epitaxially grown in the parcels on the on the nucleation layer.

6. Process as claimed in claim 5, wherein the nitride compound semiconductor epitaxially grown on the lattice matching region contains an active region with a p/n or an n/p junction.

7. Process as claimed in claim 6, wherein the active region consists of mono-layers or a superlattice for the setting of the component-relevant parameters.

8. Process as claimed in one of the claim 1, wherein a semiconductor layer having a lower bandgap than that of the active region and which enhances the contact properties is grown on the active region.

9. Process as claimed in claim 8, wherein the contact layer is locally removed by of selective etching.

10. Process as claimed in claim 1, wherein the substrate is doped.

11. Process as claimed in claim 1, wherein a metallic layer is applied to the rear side of the substrate for contacting purposes.

12. Process as claimed in claim 1, wherein the semiconductor layer arrangement grown on the silicon surface in the parcels is coated with a passivation layer.

13. Process as claimed in claim 1, wherein the epitaxial layers are used for the fabrication of an LED or a diode laser.

* * * * *